(12) United States Patent
Wehrly, Jr. et al.

(10) Patent No.: US 7,542,297 B2
(45) Date of Patent: Jun. 2, 2009

(54) OPTIMIZED MOUNTING AREA CIRCUIT MODULE SYSTEM AND METHOD

(75) Inventors: James Douglas Wehrly, Jr., Austin, TX (US); Mark Wolfe, Round Rock, TX (US); Paul Goodwin, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 129 days.

(21) Appl. No.: 11/255,061

(22) Filed: Oct. 19, 2005

(65) Prior Publication Data

US 2006/0050489 A1 Mar. 9, 2006

Related U.S. Application Data

(63) Continuation-in-part of application No. 11/231,418, filed on Sep. 21, 2005, now Pat. No. 7,443,023, which is a continuation-in-part of application No. PCT/US2005/028547, filed on Aug. 10, 2005, application No. 11/255,061, which is a continuation of application No. 11/068,688, filed on Mar. 1, 2005, now Pat. No. 7,324,352, which is a continuation-in-part of application No. 11/007,551, filed on Dec. 8, 2004, which is a continuation-in-part of application No. 10/934,027, filed on Sep. 3, 2004, application No. 11/255,061, which is a continuation-in-part of application No. 11/005,992, filed on Dec. 7, 2004, now Pat. No. 7,480,152, which is a continuation-in-part of application No. 10/934,027, filed on Sep. 3, 2004, application No. 11/255,061, which is a continuation-in-part of application No. 11/193,954, filed on Jul. 29, 2005, which is a continuation-in-part of application No. 11/007,551, filed on Dec. 8, 2004, application No. 11/255,061, which is a continuation-in-part of application No. 10/934,027, filed on Sep. 3, 2004, and a continuation-in-part of application No. 11/123,721, filed on May 6, 2005, which is a continuation-in-part of application No. 11/068,688, filed on Mar. 1, 2005, now Pat. No. 7,324,352, and a continuation-in-part of application No. 11/005,992, filed on Dec. 7, 2004, now Pat. No. 7,480,152.

(51) Int. Cl.
  *H05K 1/00* (2006.01)
(52) U.S. Cl. .................... 361/749; 174/254
(58) Field of Classification Search ................ 361/749, 361/684, 687, 690, 728, 737; 29/831, 739; 174/250, 254
See application file for complete search history.

(56) References Cited

U.S. PATENT DOCUMENTS 3,372,310 A 3/1968 Kantor (Continued)

FOREIGN PATENT DOCUMENTS

EP 122-687 (A) 10/1964

(Continued)

OTHER PUBLICATIONS

U.S. Appl. No. 11/306,803, filed Jan. 11, 2006, Chris Karabatsos.

(Continued)

*Primary Examiner*—Jeremy C Norris
*Assistant Examiner*—Yuriy Semenenko
(74) *Attorney, Agent, or Firm*—Fish & Richardson P.C.

(57) ABSTRACT

A flexible circuitry is populated with integrated circuitry (ICs) disposed along one or both of its major sides. Contacts are distributed along the flexible circuitry to provide connection between the module and an application environment. A rigid substrate is configured to provide space on one side where the populated flex is disposed while in some embodiments, heat management or cooling structures are arranged on one side of the module to mitigate thermal accumulation in the module.

14 Claims, 13 Drawing Sheets

U.S. PATENT DOCUMENTS

| | | | |
|---|---|---|---|
| 3,436,604 A | 4/1969 | Hyltin | |
| 3,582,865 A | 6/1971 | Franck et al. | |
| 3,654,394 A | 4/1972 | Gordon | |
| 3,704,455 A | 11/1972 | Scarbrough | |
| 3,718,842 A | 2/1973 | Abbott, III et al. | |
| 3,727,064 A | 4/1973 | Bottini | |
| 3,746,934 A | 7/1973 | Stein | |
| 3,766,439 A | 10/1973 | Isaacson | |
| 3,772,776 A | 11/1973 | Weisenburger | |
| 4,169,642 A | 10/1979 | Mouissie | |
| 4,288,841 A | 9/1981 | Gogal | |
| 4,342,069 A | 7/1982 | Link | |
| 4,429,349 A | 1/1984 | Zachry | |
| 4,437,235 A | 3/1984 | McIver | |
| 4,513,368 A | 4/1985 | Houseman | |
| 4,547,834 A | 10/1985 | Dumont et al. | |
| 4,567,543 A | 1/1986 | Miniet | |
| 4,587,596 A | 5/1986 | Bunnell | |
| 4,645,944 A | 2/1987 | Uya | |
| 4,656,605 A | 4/1987 | Clayton | |
| 4,672,421 A | 6/1987 | Lin | |
| 4,682,207 A | 7/1987 | Akasaki et al. | |
| 4,696,525 A | 9/1987 | Coller et al. | |
| 4,709,300 A | 11/1987 | Landis | |
| 4,724,611 A | 2/1988 | Hagihara | |
| 4,727,513 A | 2/1988 | Clayton | |
| 4,733,461 A | 3/1988 | Nakano | |
| 4,739,589 A | 4/1988 | Brehm et al. | |
| 4,763,188 A | 8/1988 | Johnson | |
| 4,771,366 A | 9/1988 | Blake et al. | |
| 4,821,007 A | 4/1989 | Fields et al. | |
| 4,823,234 A | 4/1989 | Konishi et al. | |
| 4,833,568 A | 5/1989 | Berhold | |
| 4,850,892 A | 7/1989 | Clayton et al. | |
| 4,862,249 A | 8/1989 | Carlson | |
| 4,911,643 A | 3/1990 | Perry et al. | |
| 4,953,060 A | 8/1990 | Lauffer et al. | |
| 4,956,694 A | 9/1990 | Eide | |
| 4,972,580 A | 11/1990 | Nakamura | |
| 4,982,285 A | 1/1991 | Watanabe et al. | |
| 4,983,533 A | 1/1991 | Go | |
| 4,985,703 A | 1/1991 | Kaneyama | |
| 4,992,849 A | 2/1991 | Corbett et al. | |
| 4,992,850 A | 2/1991 | Corbett et al. | |
| 5,014,115 A | 5/1991 | Moser | |
| 5,014,161 A | 5/1991 | Lee et al. | |
| 5,016,138 A | 5/1991 | Woodman | |
| 5,025,306 A | 6/1991 | Johnson et al. | |
| 5,034,350 A | 7/1991 | Marchisi | |
| 5,041,015 A | 8/1991 | Travis | |
| 5,053,853 A | 10/1991 | Haj-Ali-Ahmadi et al. | |
| 5,065,277 A | 11/1991 | Davidson | |
| 5,099,393 A | 3/1992 | Bentlage et al. | |
| 5,104,820 A | 4/1992 | Go et al. | |
| 5,109,318 A | 4/1992 | Funari et al. | |
| 5,117,282 A | 5/1992 | Salatino | |
| 5,119,269 A | 6/1992 | Nakayama | |
| 5,138,430 A | 8/1992 | Gow, III et al. | |
| 5,138,434 A | 8/1992 | Wood et al. | |
| 5,138,523 A * | 8/1992 | Benck et al. | 361/687 |
| 5,140,405 A | 8/1992 | King et al. | |
| 5,159,535 A | 10/1992 | Desai et al. | |
| 5,173,840 A | 12/1992 | Kodai et al. | |
| 5,191,404 A | 3/1993 | Wu et al. | |
| 5,208,729 A | 5/1993 | Cipolla et al. | |
| 5,214,845 A | 6/1993 | King et al. | |
| 5,219,377 A | 6/1993 | Poradish | |
| 5,222,014 A | 6/1993 | Lin | |
| 5,224,023 A | 6/1993 | Smith et al. | |
| 5,229,916 A * | 7/1993 | Frankeny et al. | 361/718 |
| 5,229,917 A | 7/1993 | Harris et al. | |
| 5,239,198 A | 8/1993 | Lin et al. | |
| 5,241,454 A | 8/1993 | Ameen et al. | |
| 5,241,456 A | 8/1993 | Marcinkiewicz et al. | |
| 5,247,423 A | 9/1993 | Lin et al. | |
| 5,252,857 A | 10/1993 | Kane et al. | |
| 5,259,770 A | 11/1993 | Bates et al. | |
| 5,261,068 A | 11/1993 | Gaskins et al. | |
| 5,268,815 A | 12/1993 | Cipolla et al. | |
| 5,276,418 A | 1/1994 | Klosowiak et al. | |
| 5,281,852 A | 1/1994 | Normington | |
| 5,285,398 A | 2/1994 | Janik | |
| 5,289,062 A | 2/1994 | Wyland | |
| 5,309,986 A | 5/1994 | Itoh | |
| 5,313,097 A | 5/1994 | Haj-Ali-Ahmadi et al. | |
| 5,343,366 A * | 8/1994 | Cipolla et al. | 361/785 |
| 5,347,428 A | 9/1994 | Carson et al. | |
| 5,362,656 A | 11/1994 | McMahon | |
| 5,375,041 A | 12/1994 | McMahon | |
| 5,386,341 A | 1/1995 | Olson et al. | |
| 5,394,300 A | 2/1995 | Yoshimura | |
| 5,397,916 A | 3/1995 | Normington | |
| 5,400,003 A | 3/1995 | Kledzik | |
| 5,428,190 A | 6/1995 | Stopperan | |
| 5,438,224 A | 8/1995 | Papageorge et al. | |
| 5,448,511 A | 9/1995 | Paurus et al. | |
| 5,463,742 A * | 10/1995 | Kobayashi | 710/303 |
| 5,471,367 A * | 11/1995 | Krumweide et al. | 361/719 |
| 5,477,082 A | 12/1995 | Buckley, III et al. | |
| 5,491,612 A | 2/1996 | Nicewarner, Jr. et al. | |
| 5,502,333 A | 3/1996 | Bertin et al. | |
| 5,523,619 A | 6/1996 | McAllister et al. | |
| 5,523,695 A | 6/1996 | Lin | |
| 5,541,812 A | 7/1996 | Burns | |
| 5,572,065 A | 11/1996 | Burns | |
| 5,600,178 A | 2/1997 | Russell | |
| 5,612,570 A | 3/1997 | Eide et al. | |
| 5,631,193 A | 5/1997 | Burns | |
| 5,642,055 A | 6/1997 | Difrancesco | |
| 5,644,161 A | 7/1997 | Burns | |
| 5,646,446 A | 7/1997 | Nicewarner et al. | |
| 5,654,877 A | 8/1997 | Burns | |
| 5,661,339 A | 8/1997 | Clayton | |
| 5,686,730 A | 11/1997 | Laudon et al. | |
| 5,688,606 A | 11/1997 | Mahulikar et al. | |
| 5,708,297 A | 1/1998 | Clayton | |
| 5,714,802 A | 2/1998 | Cloud et al. | |
| 5,717,556 A | 2/1998 | Yanagida | |
| 5,729,894 A | 3/1998 | Rostoker et al. | |
| 5,731,633 A * | 3/1998 | Clayton | 257/723 |
| 5,744,862 A | 4/1998 | Ishii | |
| 5,751,553 A * | 5/1998 | Clayton | 361/749 |
| 5,754,409 A | 5/1998 | Smith | |
| 5,764,497 A | 6/1998 | Mizumo | |
| 5,776,797 A | 7/1998 | Nicewarner, Jr. et al. | |
| 5,789,815 A | 8/1998 | Tessier et al. | |
| 5,790,447 A | 8/1998 | Laudon et al. | |
| 5,802,395 A | 9/1998 | Connolly et al. | |
| 5,805,422 A | 9/1998 | Otake et al. | |
| 5,818,699 A * | 10/1998 | Fukuoka | 361/760 |
| 5,828,125 A | 10/1998 | Burns | |
| 5,835,988 A | 11/1998 | Ishii | |
| 5,869,353 A | 2/1999 | Levy et al. | |
| 5,899,705 A | 5/1999 | Akram | |
| 5,917,709 A | 6/1999 | Johnson et al. | |
| 5,925,934 A | 7/1999 | Lim | |
| 5,926,369 A | 7/1999 | Ingraham et al. | |
| 5,949,657 A | 9/1999 | Karabatsos | |
| 5,953,214 A | 9/1999 | Dranchak et al. | |
| 5,953,215 A | 9/1999 | Karabatsos | |
| 5,959,839 A | 9/1999 | Gates | |
| 5,963,427 A | 10/1999 | Bollesen | |
| 5,973,395 A | 10/1999 | Suzuki et al. | |
| 5,995,370 A | 11/1999 | Nakamori | |

| | | | |
|---|---|---|---|
| 5,999,405 A * | 12/1999 | Zappacosta et al. ......... 361/704 | |
| 6,002,167 A | 12/1999 | Hatano et al. | |
| 6,002,589 A | 12/1999 | Perino et al. | |
| 6,008,538 A | 12/1999 | Akram et al. | |
| 6,014,316 A | 1/2000 | Eide | |
| 6,021,048 A * | 2/2000 | Smith ..................... 361/736 | |
| 6,025,992 A | 2/2000 | Dodge et al. | |
| 6,028,352 A | 2/2000 | Eide | |
| 6,028,365 A | 2/2000 | Akram et al. | |
| 6,034,878 A | 3/2000 | Osaka et al. | |
| 6,038,132 A | 3/2000 | Tokunaga et al. | |
| 6,040,624 A | 3/2000 | Chambers et al. | |
| 6,049,975 A | 4/2000 | Clayton | |
| 6,060,339 A | 5/2000 | Akram et al. | |
| 6,061,245 A * | 5/2000 | Ingraham et al. .......... 361/749 | |
| 6,072,233 A | 6/2000 | Corisis et al. | |
| 6,078,515 A | 6/2000 | Nielsen et al. | |
| 6,084,294 A | 7/2000 | Tomita | |
| 6,091,145 A | 7/2000 | Clayton | |
| 6,097,087 A | 8/2000 | Farnworth et al. | |
| 6,111,757 A | 8/2000 | Dell et al. | |
| 6,121,676 A | 9/2000 | Solberg | |
| RE36,916 E | 10/2000 | Moshayedi | |
| 6,157,541 A | 12/2000 | Hacke | |
| 6,172,874 B1 | 1/2001 | Bartilson | |
| 6,178,093 B1 | 1/2001 | Bhatt et al. | |
| 6,180,881 B1 | 1/2001 | Isaak | |
| 6,187,652 B1 | 2/2001 | Chou et al. | |
| 6,205,654 B1 | 3/2001 | Burns | |
| 6,208,521 B1 | 3/2001 | Nakatsuka | |
| 6,208,546 B1 | 3/2001 | Ikeda | |
| 6,214,641 B1 | 4/2001 | Akram | |
| 6,215,181 B1 | 4/2001 | Akram et al. | |
| 6,215,687 B1 | 4/2001 | Sugano et al. | |
| 6,222,737 B1 | 4/2001 | Ross | |
| 6,222,739 B1 | 4/2001 | Bhakta et al. | |
| 6,225,688 B1 | 5/2001 | Kim et al. | |
| 6,232,659 B1 | 5/2001 | Clayton | |
| 6,233,650 B1 | 5/2001 | Johnson et al. | |
| 6,234,820 B1 | 5/2001 | Perino et al. | |
| 6,262,476 B1 | 7/2001 | Vidal | |
| 6,262,895 B1 | 7/2001 | Forthun | |
| 6,265,660 B1 | 7/2001 | Tandy | |
| 6,266,252 B1 | 7/2001 | Karabatsos | |
| 6,281,577 B1 | 8/2001 | Oppermann et al. | |
| 6,288,907 B1 | 9/2001 | Burns | |
| 6,288,924 B1 | 9/2001 | Sugano et al. | |
| 6,300,679 B1 | 10/2001 | Mukerji et al. | |
| 6,316,825 B1 | 11/2001 | Park et al. | |
| 6,323,060 B1 | 11/2001 | Isaak | |
| 6,336,262 B1 | 1/2002 | Dalal et al. | |
| 6,343,020 B1 | 1/2002 | Lin et al. | |
| 6,347,394 B1 | 2/2002 | Ochoa et al. | |
| 6,349,050 B1 | 2/2002 | Woo et al. | |
| 6,351,029 B1 | 2/2002 | Isaak | |
| 6,357,023 B1 | 3/2002 | Co et al. | |
| 6,358,772 B2 | 3/2002 | Miyoshi | |
| 6,360,433 B1 | 3/2002 | Ross | |
| 6,368,896 B2 | 4/2002 | Farnworth et al. | |
| 6,370,668 B1 | 4/2002 | Garrett, Jr. et al. | |
| 6,376,769 B1 | 4/2002 | Chung | |
| 6,392,162 B1 | 5/2002 | Karabatsos | |
| 6,395,992 B1 * | 5/2002 | Nakayama et al. .......... 174/254 | |
| 6,404,043 B1 | 6/2002 | Isaak | |
| 6,410,857 B1 | 6/2002 | Gonya | |
| 6,426,240 B2 | 7/2002 | Isaak | |
| 6,426,549 B1 | 7/2002 | Isaak | |
| 6,426,560 B1 | 7/2002 | Kawamura et al. | |
| 6,428,360 B2 | 8/2002 | Hassanzadeh et al. | |
| 6,433,418 B1 | 8/2002 | Fujisawa et al. | |
| 6,444,921 B1 | 9/2002 | Wang et al. | |
| 6,446,158 B1 | 9/2002 | Karabatsos | |
| 6,449,159 B1 * | 9/2002 | Haba ..................... 361/707 | |
| 6,452,826 B1 | 9/2002 | Kim et al. | |
| 6,459,152 B1 | 10/2002 | Tomita et al. | |
| 6,462,412 B2 | 10/2002 | Kamei et al. | |
| 6,465,877 B1 | 10/2002 | Farnworth et al. | |
| 6,465,893 B1 | 10/2002 | Khandros et al. | |
| 6,472,735 B2 | 10/2002 | Isaak | |
| 6,473,308 B2 | 10/2002 | Forthun | |
| 6,486,544 B1 | 11/2002 | Hashimoto | |
| 6,489,687 B1 | 12/2002 | Hashimoto | |
| 6,502,161 B1 | 12/2002 | Perego et al. | |
| 6,514,793 B2 | 2/2003 | Isaak | |
| 6,521,984 B2 | 2/2003 | Matsuura | |
| 6,528,870 B2 | 3/2003 | Fukatsu et al. | |
| 6,531,772 B2 | 3/2003 | Akram et al. | |
| 6,544,815 B2 | 4/2003 | Isaak | |
| 6,552,910 B1 | 4/2003 | Moon et al. | |
| 6,552,948 B2 | 4/2003 | Woo et al. | |
| 6,560,117 B2 | 5/2003 | Moon | |
| 6,566,746 B2 | 5/2003 | Isaak et al. | |
| 6,572,387 B2 | 6/2003 | Burns et al. | |
| 6,573,593 B1 | 6/2003 | Syri et al. | |
| 6,576,992 B1 | 6/2003 | Cady et al. | |
| 6,588,095 B2 | 7/2003 | Pan | |
| 6,590,282 B1 | 7/2003 | Wang et al. | |
| 6,590,781 B2 * | 7/2003 | Kollipara et al. ............ 361/760 |
| 6,600,222 B1 | 7/2003 | Levardo | |
| 6,614,664 B2 | 9/2003 | Lee | |
| 6,627,984 B2 | 9/2003 | Bruce et al. | |
| 6,629,855 B1 | 10/2003 | North et al. | |
| 6,646,936 B2 | 11/2003 | Hamamatsu et al. | |
| 6,660,561 B2 | 12/2003 | Forthun | |
| 6,661,092 B2 | 12/2003 | Shibata et al. | |
| 6,677,670 B2 | 1/2004 | Kondo | |
| 6,683,377 B1 | 1/2004 | Shim et al. | |
| 6,690,584 B2 | 2/2004 | Uzuka et al. | |
| 6,699,730 B2 | 3/2004 | Kim et al. | |
| 6,720,652 B2 | 4/2004 | Akram et al. | |
| 6,721,181 B1 | 4/2004 | Pfeifer et al. | |
| 6,721,185 B2 | 4/2004 | Dong et al. | |
| 6,721,226 B2 | 4/2004 | Woo et al. | |
| 6,744,656 B2 | 6/2004 | Sugano et al. | |
| 6,751,113 B2 | 6/2004 | Bhakta et al. | |
| 6,756,661 B2 | 6/2004 | Tsuneda et al. | |
| 6,760,220 B2 | 7/2004 | Canter et al. | |
| 6,762,942 B1 | 7/2004 | Smith | |
| 6,768,660 B2 | 7/2004 | Kong et al. | |
| 6,833,981 B2 | 12/2004 | Suwabe et al. | |
| 6,833,984 B1 | 12/2004 | Belgacem | |
| 6,839,266 B1 | 1/2005 | Garrett, Jr. et al. | |
| 6,841,868 B2 | 1/2005 | Akram et al. | |
| 6,850,414 B2 | 2/2005 | Benisek et al. | |
| 6,873,534 B2 | 3/2005 | Bhakta et al. | |
| 6,878,571 B2 | 4/2005 | Isaak et al. | |
| 6,884,653 B2 | 4/2005 | Larson | |
| 6,888,719 B1 * | 5/2005 | Janzen et al. ............... 361/687 |
| 6,914,324 B2 | 7/2005 | Rapport et al. | |
| 6,919,626 B2 | 7/2005 | Burns | |
| 6,956,284 B2 | 10/2005 | Cady et al. | |
| 7,053,478 B2 | 5/2006 | Roper et al. | |
| 7,094,632 B2 | 8/2006 | Cady et al. | |
| 7,180,167 B2 | 2/2007 | Partridge et al. | |
| 7,393,226 B2 | 7/2008 | Clayton et al. | |
| 7,394,149 B2 | 7/2008 | Clayton et al. | |
| 2001/0001085 A1 | 5/2001 | Hassanzadeh et al. | |
| 2001/0006252 A1 | 7/2001 | Kim et al. | |
| 2001/0013423 A1 | 8/2001 | Dalai et al. | |
| 2001/0015487 A1 | 8/2001 | Forthun | |
| 2001/0026008 A1 | 10/2001 | Tsuneda et al. | |
| 2001/0028588 A1 | 10/2001 | Yamada et al. | |
| 2001/0035572 A1 | 11/2001 | Isaak | |
| 2001/0040793 A1 | 11/2001 | Inaba | |
| 2001/0052637 A1 | 12/2001 | Akram et al. | |
| 2002/0001216 A1 | 1/2002 | Sugano et al. | |

| | | | |
|---|---|---|---|
| 2002/0006032 A1 | 1/2002 | Karabatsos | |
| 2002/0030995 A1 | 3/2002 | Shoji | |
| 2002/0076919 A1 | 6/2002 | Peters et al. | |
| 2002/0094603 A1 | 7/2002 | Isaak | |
| 2002/0101261 A1 | 8/2002 | Karabatsos | |
| 2002/0139577 A1 | 10/2002 | Miller | |
| 2002/0164838 A1 | 11/2002 | Moon et al. | |
| 2002/0180022 A1 | 12/2002 | Emoto | |
| 2002/0185731 A1 | 12/2002 | Akram et al. | |
| 2002/0196612 A1 | 12/2002 | Gall et al. | |
| 2003/0002262 A1 | 1/2003 | Benisek et al. | |
| 2003/0026155 A1 | 2/2003 | Yamagata | |
| 2003/0035328 A1 | 2/2003 | Hamamatsu et al. | |
| 2003/0045025 A1 | 3/2003 | Coyle et al. | |
| 2003/0049886 A1 | 3/2003 | Salmon | |
| 2003/0064548 A1 | 4/2003 | Isaak | |
| 2003/0081387 A1 | 5/2003 | Schulz | |
| 2003/0081392 A1 | 5/2003 | Cady et al. | |
| 2003/0089978 A1 | 5/2003 | Miyamoto et al. | |
| 2003/0090879 A1 | 5/2003 | Doblar et al. | |
| 2003/0096497 A1 | 5/2003 | Moore et al. | |
| 2003/0109078 A1 | 6/2003 | Takahashi et al. | |
| 2003/0116835 A1 | 6/2003 | Miyamoto et al. | |
| 2003/0159278 A1 | 8/2003 | Peddle | |
| 2003/0168725 A1 | 9/2003 | Warner et al. | |
| 2004/0000708 A1* | 1/2004 | Rapport et al. | 257/686 |
| 2004/0012991 A1 | 1/2004 | Kozaru | |
| 2004/0021211 A1 | 2/2004 | Damberg | |
| 2004/0099938 A1 | 5/2004 | Kang et al. | |
| 2004/0150107 A1 | 8/2004 | Cha et al. | |
| 2004/0229402 A1 | 11/2004 | Cady et al. | |
| 2004/0236877 A1 | 11/2004 | Burton | |
| 2005/0082663 A1 | 4/2005 | Wakiyama et al. | |
| 2005/0108468 A1 | 5/2005 | Hazelzet et al. | |
| 2005/0133897 A1 | 6/2005 | Baek et al. | |
| 2005/0242423 A1 | 11/2005 | Partridge et al. | |
| 2005/0263911 A1 | 12/2005 | Igarashi et al. | |
| 2006/0020740 A1 | 1/2006 | Bartley et al. | |
| 2006/0050496 A1 | 3/2006 | Goodwin | |
| 2006/0050497 A1 | 3/2006 | Goodwin | |
| 2006/0053345 A1 | 3/2006 | Goodwin | |
| 2006/0091529 A1 | 5/2006 | Wehrly et al. | |
| 2006/0095592 A1 | 5/2006 | Borkenhagen | |
| 2006/0111866 A1 | 5/2006 | LeClerg et al. | |
| 2006/0125067 A1 | 6/2006 | Wehrly et al. | |
| 2007/0211426 A1 | 9/2007 | Clayton et al. | |
| 2007/0211711 A1 | 9/2007 | Clayton | |
| 2007/0212906 A1 | 9/2007 | Clayton et al. | |
| 2007/0212920 A1 | 9/2007 | Clayton et al. | |
| 2008/0192428 A1 | 8/2008 | Clayton et al. | |

FOREIGN PATENT DOCUMENTS

| | | |
|---|---|---|
| EP | 0 296 211 A3 | 1/1969 |
| EP | 1 119049 A2 | 7/2001 |
| GB | 2 130 025 A | 5/1964 |
| JP | 53-85159 | 7/1978 |
| JP | 58-96756 (A) | 6/1983 |
| JP | 3-102862 | 4/1991 |
| JP | 5-29534 (A) | 2/1993 |
| JP | 5-335895 (A) | 12/1993 |
| JP | 2821316 (B2) | 11/1998 |
| JP | 2001/077294 (A) | 3/2001 |
| JP | 2001/085592 (A) | 3/2001 |
| JP | 2001/332683 (A) | 11/2001 |
| JP | 2002/009231 (A) | 1/2002 |
| JP | 2003/037246 (A) | 2/2003 |
| JP | 2003/086760 (A) | 3/2003 |
| JP | 2003/086761 (A) | 3/2003 |
| JP | 2003/309246 (A) | 10/2003 |
| JP | 2003/347503 (A) | 12/2003 |
| WO | WO03/037053 | 5/2003 |
| WO | WO 03/037053 A1 | 5/2003 |
| WO | WO 2004/109802 A1 | 12/2004 |

OTHER PUBLICATIONS

Complaint filed Mar. 8, 2007, in the United States District Court for the District of Massachusetts, Boston Division, Civil Action No. 07 CA 10468 DPW.

Letter dated Sep. 11, 2006, from Chris Karabatsos of Kentron Technologies to John Kelly, President of JEDEC Solid State Technology Association, concerning potential interferences involving U.S. App. No. 11/306,803.

Pages 19-22 of Presentation by Netlist, Aug. 2004.

Flexible Printed Circuit Technology—A Versatile Interconnection Option. (Website 2 pages) Fjelstad, Joseph. Dec. 3, 2002.

Die Products: Ideal IC Packaging for Demanding Applications—Advanced packaging that's no bigger than the die itself brings together high performance and high reliability with small size and low cost. (Website 3 pages with 2 figures) Larry Gilg and Chris Windsor. Dec. 23, 2002, Published on Internet.

Tessera uZ Ball Stack Package. 4 figures that purport to be directed to the uZ—Ball Stacked Memory, Published on the Internet.

Chip Scale Review Online—An Independent Journal Dedicated to the Advancement of Chip-Scale Electronics (Weiste 9 pages) Fjelstad, Joseph, Pacific Consultants L.L.C., Published Jan. 2001 on Internet.

Flexible Thinking: Examining the Flexible Circuit Tapes. (Website 2 pages) Fjelstad, Joseph., Published Apr. 20, 2000 on Internet.

Ron Bauer, Intel. "Stacked-CSP Delivers Flexibility, Reliability, and Space-Saving Capabilities", vol. 3, Spring 2002. Published on the Internet.

Tessera Technologies, Inc.—Semiconductor Intellectual Property, Chip Scale Packaging—Website pages (3), Internet.

Tessera Introduces uZ a—Ball Stacked Memory Package for Computing and Portable Electronic Products Joyce Smaragdis, Tessera Public Relations. Sandy Skees, MCA PR (www.tessera.com/news_events/press_coverage.cfm): 2 figures that purport to be directed to the uZ a—Ball Stacked Memory Package. Published Jul. 17, 2002 in San Jose, Ca.

William R. Newberry, Design Techniques for Ball Grid Arrays, Xynetix Design Systems, Inc., Portland, Maine, Published on the Internet.

Chip Scale Packaging and Redistribution, Paul A. Magill, Glenn A. Rinne, J. Daniel Mls, Wayne C. Machon, Joseph W. Baggs, Unitive Electronics Inc.

Dense-Pac Microsystems, 16 Megabit High Speed CMOS SRAM DPS1MX16MKn3.

Dense-Pac Microsystems, 256 Megabyte CMOS DRAM DP3ED32MS72RW5.

Dense-Pac Microsystems, Breaking Space Barriers, 3-D Technology 1993.

Dense-Pac Microsystems, DPS512X16A3, Ceramic 512K×16 CMOS SRAM Module.

IBM Preliminary 168 Pin SDRAM Registered DIMM Functional Description & Timing Diagrams.

3D Interconnection for Ultra-Dense Multichip Modules, Christian Val, Thomson-CSF DCS Computer Division, Thierry Lemoine, Thomson-CSF RCM Radar Countermeasures Division.

High Density Memory Packaging Technology High Speed Imaging Applications, Dean Frew, Texas Instruments Incorporated.

Vertically-Integrated Package, Alvin Weinberg, Pacesetter, Inc. and W. Kinzy Jones, Florida International University.

PCT/US05/28547 International Search Report and Written Opinion, PCT, Aug. 18, 2006.

PCT/US05/28547 Notification Concerning Transmittal of Copy of International Preliminary Report on Patentability, Mar. 15, 2007.

GB 0516622.8 Search Report, May 25, 2006.

PCT/US06/04690 International Search Report, PCT, Feb. 16, 2007.

PCT/US06/38720 International Search Report and Written Opinion, PCT, Apr. 5, 2007.

PCT/US06/04690 International Search Report, PCT, Jul. 20, 2007.

PCT/US06/06921 International Search Report and Written Opinion, PCT, Jun. 1, 2007.

PCT/US2006/007193, International Search Report and Written Opinion of the International Searching Authority, PCT, Nov. 7, 2007.

\* cited by examiner

OPTIMIZED MOUNTING AREA CIRCUIT MODULE SYSTEM AND METHOD

RELATED APPLICATIONS

This application is a continuation-in-part of U.S. patent application Ser. No. 11/231,418 filed Sep. 21, 2005, now U.S. Pat. No. 7,443,023, which is a continuation-in-part of Pat. App. No. PCT/US05/28547 filed Aug. 10, 2005, pending, and this application is further a continuation-in-part of U.S. patent application Ser. No. 11/068,688 filed Mar. 1, 2005, now U.S. Pat. No. 7,324,352, which application is a continuation-in-part of U.S. patent application Ser. No. 11/007,551 filed Dec. 8, 2004, pending, which application is a continuation-in-part of U.S. patent application Ser. No. 10/934,027 filed Sep. 3, 2004, pending. This application is also a continuation-in-part of U.S. patent application Ser. No. 11/005,992 filed Dec. 7, 2004, now U.S. Pat. No. 7,480,152, which application is a continuation-in-part of U.S. patent application Ser. No. 10/934,027 filed Sep. 3, 2004. This application is also a continuation-in-part of U.S. patent application Ser. No. 11/193,954 filed Jul. 29, 2005, pending, which application is a continuation-in-part of U.S. patent application Ser. No. 11/007,551 filed Dec. 8, 2004. This application is also a continuation-in-part of U.S. patent application Ser. No. 10/934,027 filed Sep. 3, 2004, pending. This application is also a continuation-in-part of U.S. patent application Ser. No. 11/123,721 filed May 6, 2005, pending, which application is a continuation-in-part of both U.S. patent application Ser. No. 11/068,688 filed Mar. 1, 2005 now U.S. Pat. No. 7,324,352 and U.S. patent application Ser. No. 11/005,992 filed Dec. 7, 2004 now U.S. Pat. No. 7,480,152.

U.S. patent application Ser. No. 11/231,418; Pat. App. No. PCT/US05/28547; U.S. patent application Ser. No. 10/934,027; U.S. patent application Ser. No. 11/068,688; U.S. patent application Ser. No. 11/005,992; U.S. patent application Ser. No. 11/193,954; U.S. patent application Ser. No. 11/123,721; and U.S. patent application Ser. No. 11/007,551 are each hereby incorporated by reference herein.

FIELD

The present invention relates to systems and methods for creating high density circuit modules and, in particular, to systems and methods for creating such modules that provide optimized areas for IC devices.

BACKGROUND

Memory expansion is one of the many fields where high density circuit module solutions provide space-saving advantages. For example, the well-known DIMM (Dual In-line Memory Module) has been used for years, in various forms, to provide memory expansion. A typical DIMM includes a conventional PCB (printed circuit board) with memory devices and supporting digital logic devices mounted on both sides. The DINM is typically mounted in the host computer system by inserting a contact-bearing edge of the DIMM into a card edge connector. Typically, systems that employ DIMMs provide limited profile space for such devices and conventional DIMM-based solutions have typically provided only a moderate amount of memory expansion.

As bus speeds have increased, fewer devices per channel can be reliably addressed with a DIMM-based solution. For example, 288 ICs or devices per channel may be addressed using the SDRAM-100 bus protocol with an unbuffered DIMM. Using the DDR-200 bus protocol, approximately 144 devices may be addressed per channel. With the DDR2-400 bus protocol, only 72 devices per channel may be addressed. This constraint has led to the development of the fully-buffered DIMM (FB-DIMM) with buffered C/A and data in which 288 devices per channel may be addressed. That buffering function is provided by what is typically identified as the Advanced Memory Buffer or AMB. With the FB-DIMM, not only has capacity increased, pin count has declined to approximately 69 signal pins from the approximately 240 pins previously required.

The FB-DIMM circuit solution is expected to offer practical motherboard memory capacities of up to about 192 gigabytes with six channels and eight DIMMs per channel and two ranks per DIMM using one gigabyte DRAMs. This solution should also be adaptable to next generation technologies and should exhibit significant downward compatibility. The FB-DIMM solution does, however, generate significant thermal energy, particularly about the AMB.

There are several known methods to improve the limited capacity of a DIMM or other circuit board. In one strategy, for example, small circuit boards (daughter cards) are connected to the DIMM to provide extra mounting space.

In another strategy, multiple die packages (MDP) can also be used to increase DINM capacity. This scheme increases the capacity of the memory devices on the DIMM by including multiple semiconductor die in a single device package. The additional heat generated by the multiple die typically requires, however, additional cooling capabilities to operate at maximum operating speed. Further, the MDP scheme may exhibit increased costs because of increased yield loss from packaging together multiple die that are not fully pre-tested.

Stacked packages are yet another way to increase module capacity. Capacity is increased by stacking packaged integrated circuits to create a high-density circuit module for mounting on the larger circuit board. In some techniques, flexible conductors are used to selectively interconnect packaged integrated circuits. Staktek Group L.P., the assignee of the present application, has developed numerous systems for aggregating CSP (chipscale packaged) devices in space saving topologies. The increased component height of some stacking techniques may, however, alter system requirements such as, for example, required cooling airflow or the minimum spacing around a circuit board on its host system.

Typically, the known methods for improved memory module performance or enlarged capacity raise thermal management issues. For example, when a conventional packaged DRAM is mounted on a DIMM, the primary thermal path is through the balls of the package into the core of a multilayer DIMM that has less than desirable thermal characteristics. In particular, when an advanced memory buffer (AMB) is employed in an FB-DIMM, a significant amount of heat is generated. Consequently, the already marginal thermal shedding attributes of DIMM circuit modules is exacerbated in a typical FB-DIMM by the localized generation of heat by the AMB.

What is needed, therefore, are methods and structures for providing high capacity circuit boards in thermally-efficient, reliable designs.

SUMMARY

A flexible circuitry is populated with integrated circuitry (ICs) disposed along one or both of its major sides. Contacts are distributed along the flexible circuitry to provide connection between the module and an application environment. A rigid substrate is configured to provide space on one side where the populated portion of the flex is disposed at least in part while in some embodiments, heat management or cooling structures are arranged on one side of the module to mitigate thermal accumulation in the module.

DETAILED DESCRIPTION OF PREFERRED EMBODIMENTS

Figure 1:
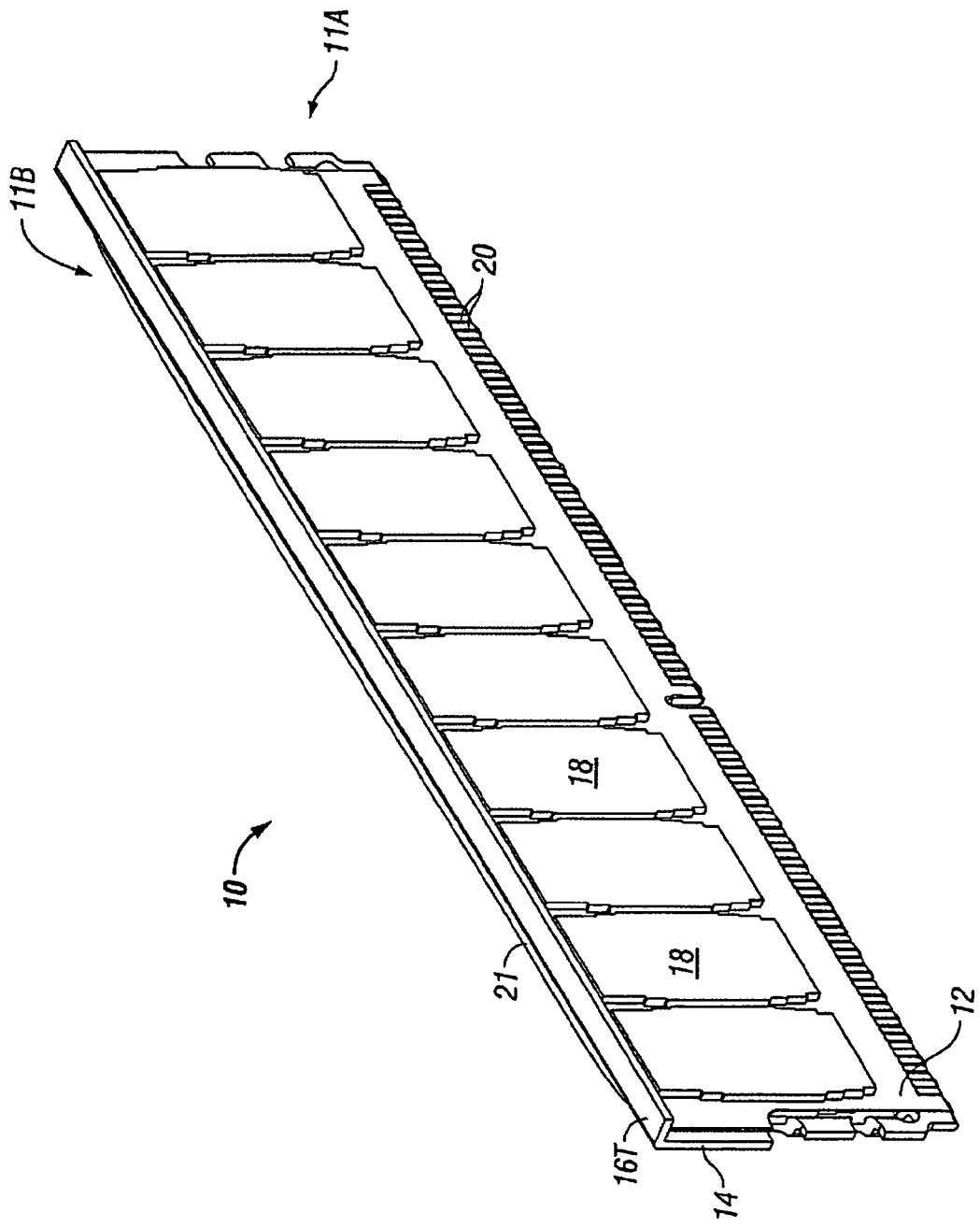
FIG. 1 depicts one side of a module devised in accordance with a preferred embodiment of the present invention.

FIG. 1 depicts a module 10 devised in accordance with a preferred embodiment of the present invention. The depiction of FIG. 1 illustrates module 10 having a substrate 14 about a part of which is disposed flex circuit 12 populated with ICs 18 which are, in one preferred embodiment, memory devices in CSP packages. The profiles shown for ICs 18 are, however, structured to indicate just some configurations of the many of ICs that may be employed as ICs 18 in some embodiments of the present invention. While some modules 10 may be employed as memory modules to supplant more traditionally constructed DIMM modules, other configurations of module 10 may have a primary function other than memory such as, for example, communications or graphics. Further a variety of memory modules may be configured in conformity with the principles of the invention and some such memory configurations will exhibit fully-buffered DIMM ("FB-DIMM") circuitry.

Figure 2:
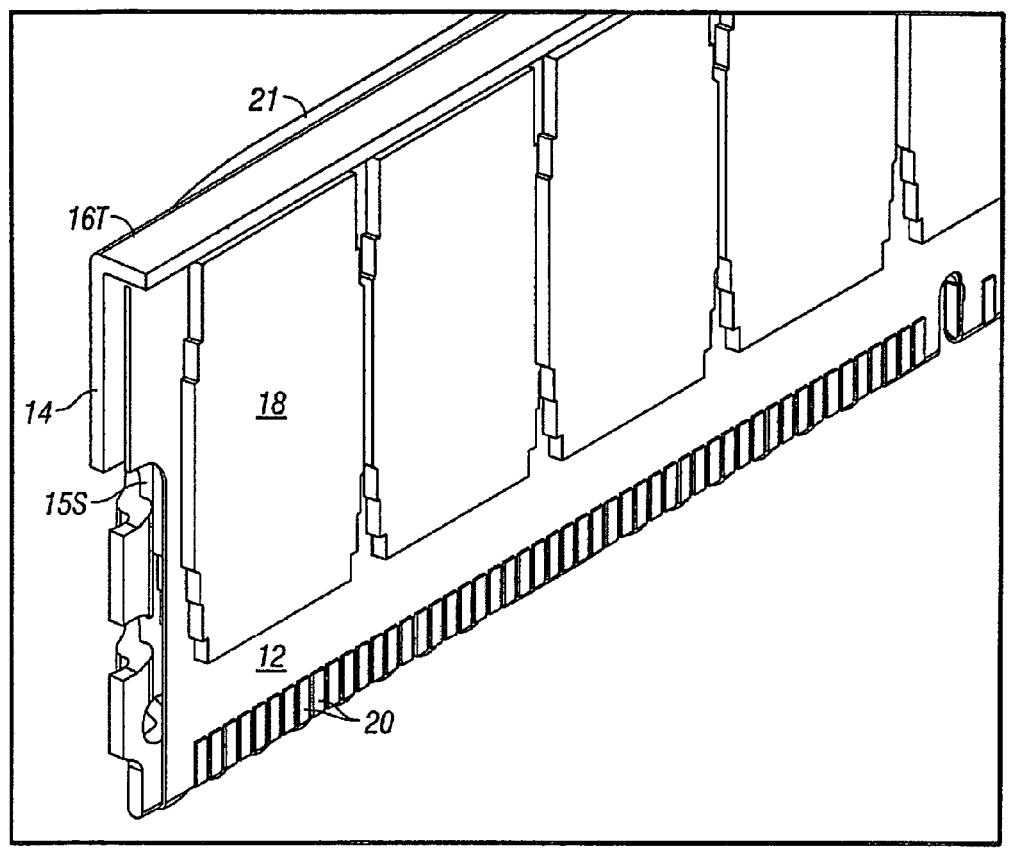
FIG. 2 is an enlarged view of a portion of a side of a module devised in accordance with a preferred embodiment of the present invention.

Optional extension 16T is shown diverging from the axis ($A_{XB}$) of the substrate body (shown in FIG. 4) of substrate 14. Extension 16T, which may come in a variety of configurations, increases the cooling area for module 10 while providing a surface for insertion force application. Side 11A of module 10 is the primary perspective of FIG. 1, but a small part of thermal management structure 21 is visible. In addition to extension 16T, cooling structure 21 increases the cooling surface for module 10. FIG. 2 is an enlarged depiction of a part of module 10. In the view of FIG. 2, substrate space 15S may be discerned which is formed by the offset between portions of substrate 14 as will be further described.

Figure 3:
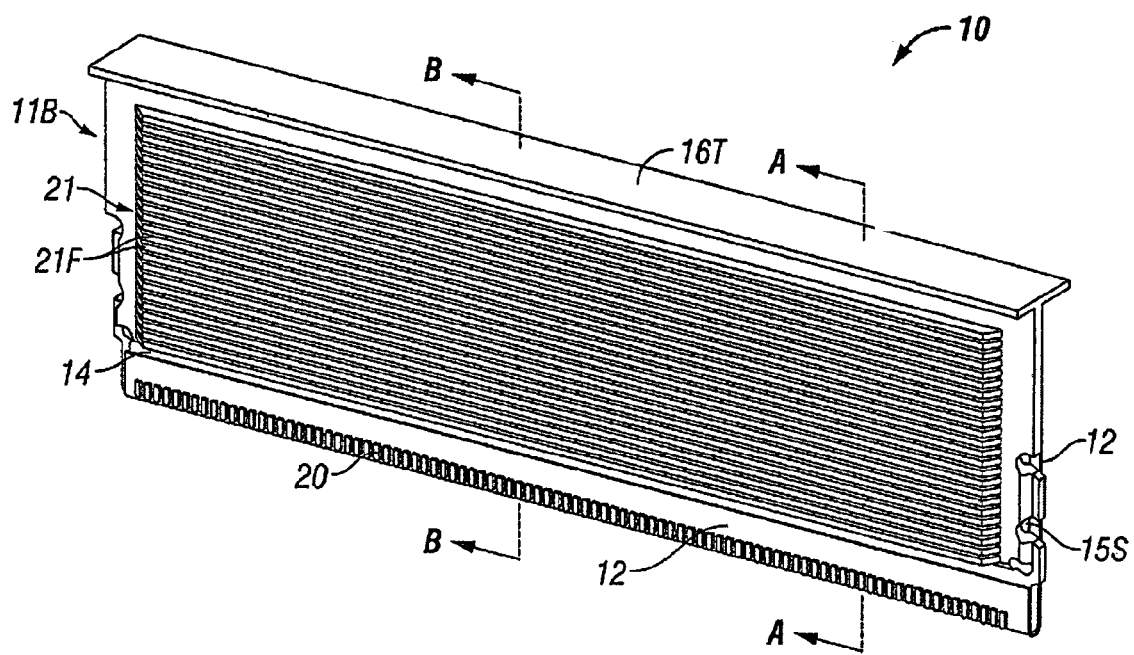
FIG. 3 is a perspective view of another side of a module devised in accordance with a preferred embodiment of the present invention.

FIG. 3 depicts side 11B of a module 10 devised in accordance with a preferred embodiment of the present invention. In the depicted embodiment of FIG. 3, thermal management or cooling structure 21 is configured as integral with substrate 14. In other depicted embodiments, a thermal management or cooling structure 21 is configured separately from substrate 14 but appended to become a part of substrate 14 while in other embodiments, there is no cooling structure 21.

In the depicted embodiment, thermal management or cooling structure 21 comprises plural fins 21F which may be configured in any number and orientation and need not extend laterally nor extend across the entirely of the module. As a later cross-section shows, some embodiments of the present invention exhibit no fins and thus those of skill should understand that although fin structures 21F provide added surface area to module 10, their presence is not required. Further, neither cooling structure 21 nor extension 16T are required.

Figure 4:
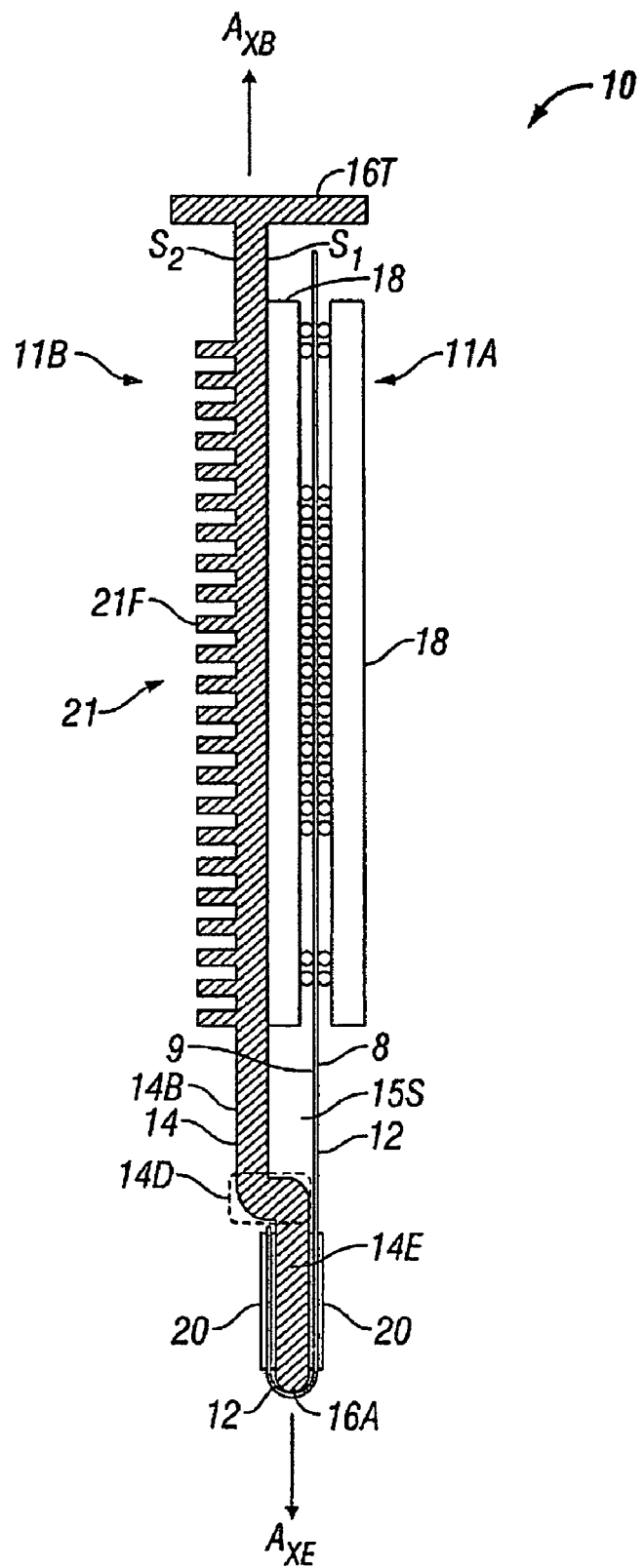
FIG. 4 is a cross-sectional view of a module taken through section line A-A of FIG. 3.

FIG. 4 is cross-section along line A-A of FIG. 3. As shown, a portion of flex circuit 12 is disposed about end 16A of substrate 14. As shown in FIG. 4, in the depicted embodiment, substrate space 15S is created on side 11A of module 10 by the offset of substrate body 14B from substrate end portion 14E realized through deflection 14D. Deflection 14D may also be described as a bend, offset, or diversion, just as examples of the nomenclature that could be employed to indicate the axial offsetting of axis $A_{XB}$ of substrate body 14B from axis $A_{XE}$ of end portion 14E of substrate 14 to realize substrate space 15S into which in the depicted embodiment, at least a portion of ICs 18 are depicted as being disposed. Later depictions of modules 10 that employ larger profile ICs 19 such as an AMB populated along the inner side of flex circuit 12 will show that at least a part of IC 19 is disposed in substrate space 15S.

Those of skill will recognize that substrate 14 may be comprised of more than one piece, but still exhibit the principles disclosed herein as they relate to the offsetting of one part of the employed substrate from another to create substrate space 15S to allow the populated part of flex circuit 12 to reside on side 11A of module 10. By disposing the populated area of flex circuit 12 on one side of module 10, this leaves a substantial are of the other side of module 10 available for thermal management structure(s) 21 which in the depicted embodiment comprises a plurality of fins. Other structures besides fins may be employed for cooling structure 21 as those of skill will recognize and where fin-like structures are employed, they need not be oriented perpendicularly to illustrated substrate body axis $A_{XB}$.

Figure 5:
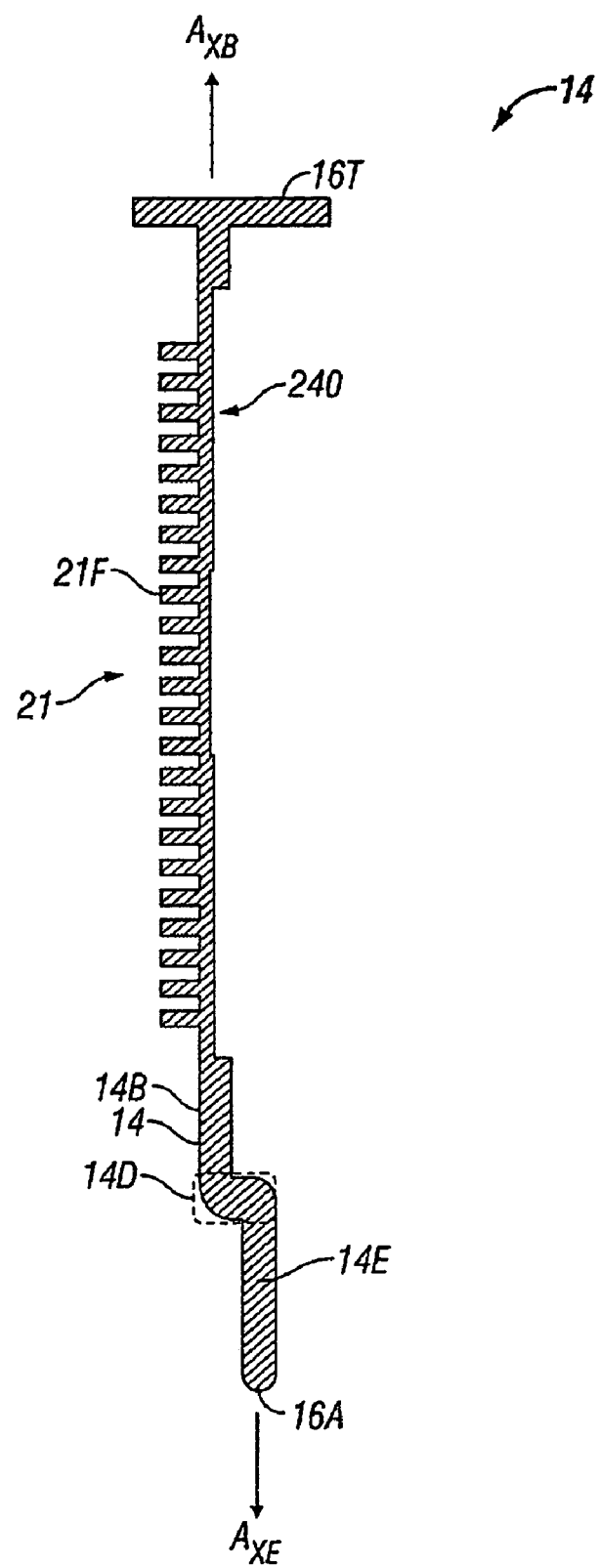
FIG. 5 depicts a cross-sectional view of a rigid substrate employed in an alternate preferred embodiment of the present invention taken along line B-B of FIG. 3.

FIG. 5 depicts a substrate 14 as may be employed in an alternative embodiment in accordance with the present invention. Illustrated substrate 14 is shown with inset or cutaway area 14 disposed in substrate 240 at a position that corresponds with section line B-B in FIG. 3. Insert area 240 provides a profile-lowering inset that reduces the increase in module profile that would otherwise arise from disposition of a higher profile device on flex circuit 12. An example is shown in FIG. 6.

Figure 6:
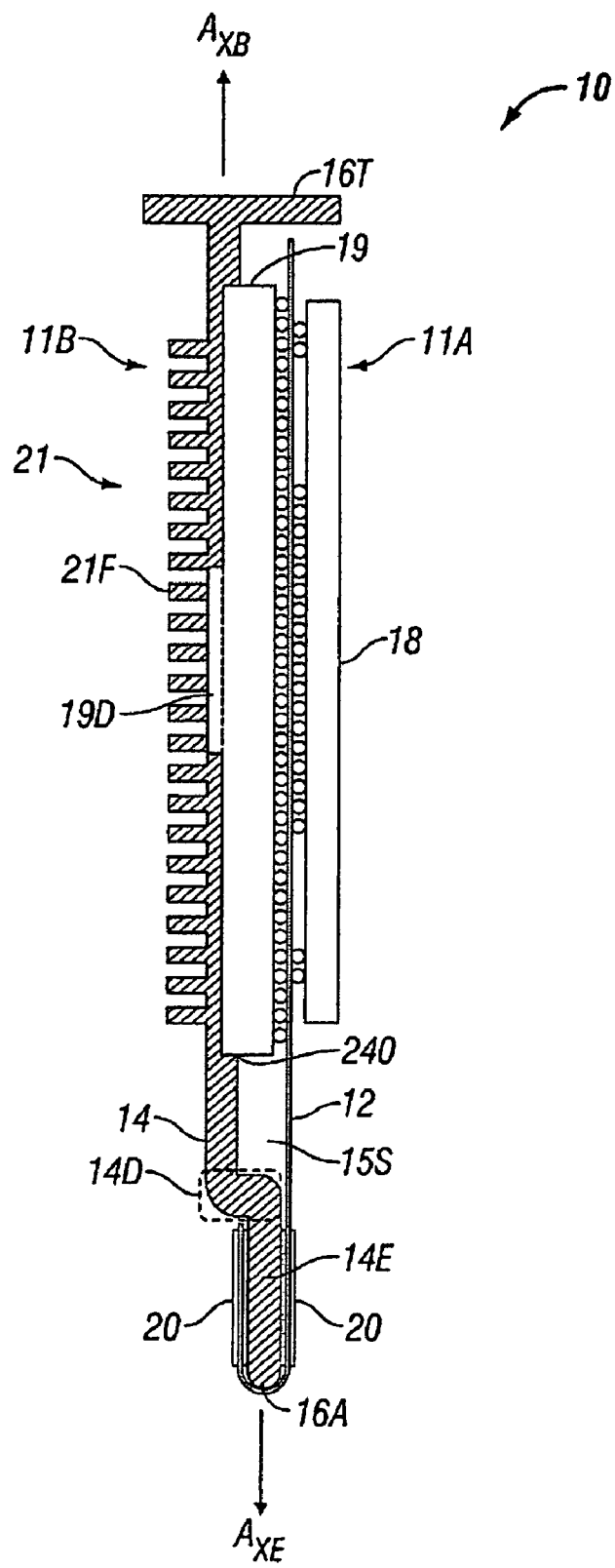
FIG. 6 depicts a cross-sectional view of a module devised in accordance with a preferred embodiment that employs a substrate similar to that shown in FIG. 5.

FIG. 6 depicts an exemplar module 10 in accordance with an embodiment of the present invention. In the depicted module 10, IC 19 is shown disposed in part in cutaway area 240, an example of which is shown in FIG. 5 that has been configured to accommodate at least a part of IC 19. The profile depicted for IC 19 is representative of an advanced memory buffer ("AMB") such as employed in a FB-DIMM, but module 10 may be devised with a variety of ICs including microprocessors and logic as well as buffers and control devices and/or memory devices. Consequently, the similarity of the depicted profile shown for IC 19 with the profile of an AMB should be understood to be merely representative and those of skill should understand that IC 19 may, in other embodiments, be any of the other non-memory devices known to useful in the context of a device such as module 10. Thus, some embodiments of module 10 will include ICs of a first type such as memory, while other embodiments may include ICs of a first type such as memory and ICs of a second type such as logic, microprocessor, buffer, or control integrated circuitry or, in some cases, a module may include memory, microprocessor/logic, and buffer/control circuitry, for example. This is not an exhaustive list as those of skill will recognize, but merely a shorthand way to identify just some of the many types of ICs that may, in some cases, be employed in modules 10.

Figure 7:
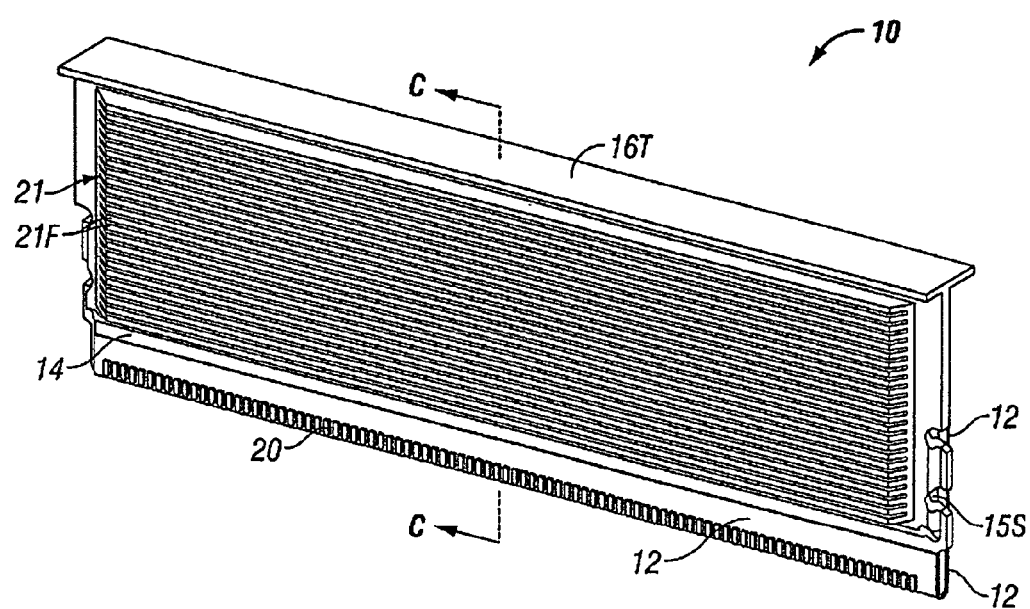
FIG. 7 is a perspective view of a side of a module in accordance with a preferred embodiment of the present invention.

FIG. 7 depicts another preferred embodiment in accordance with the present invention. As shown, module 10 includes cooling structure 21 appended to become a part of substrate 14.

Figure 8:
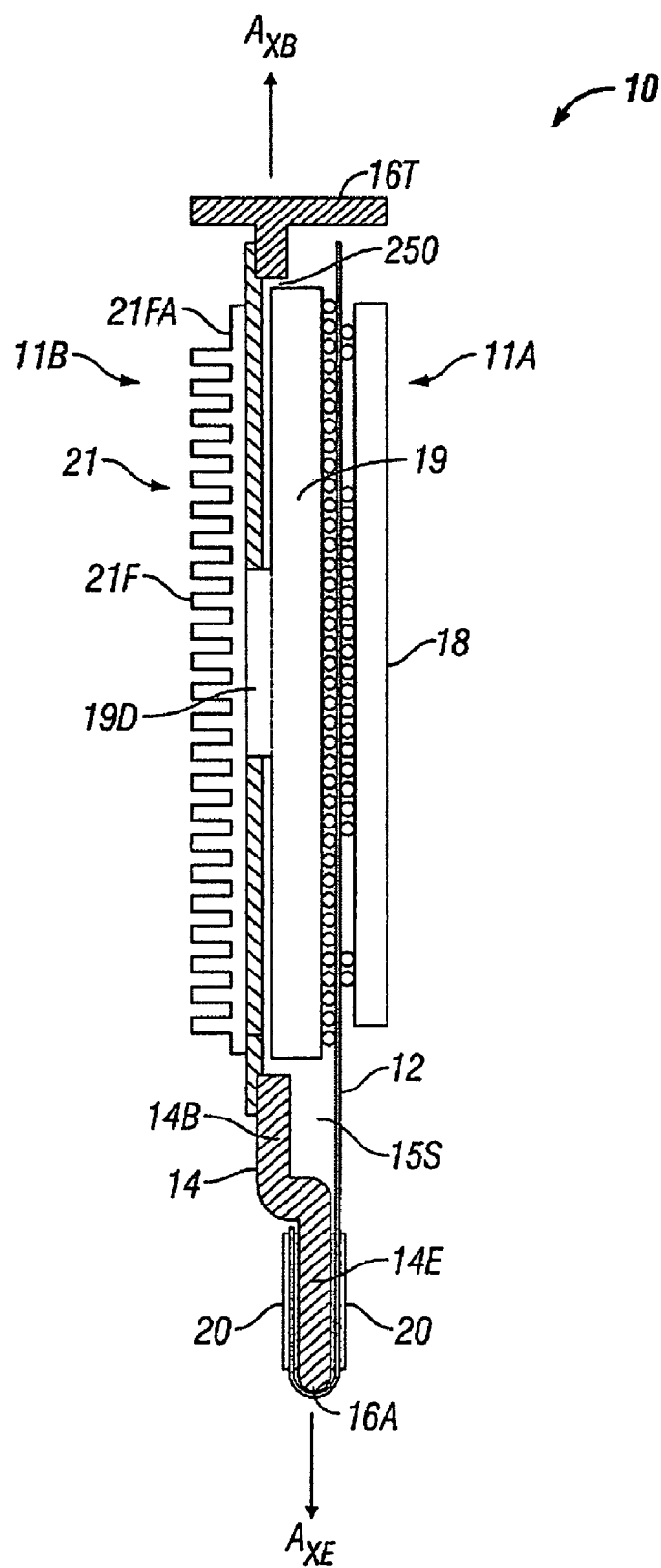
FIG. 8 is a cross-sectional view taken along section line C-C of FIG. 7.

FIG. 8 is a cross-sectional view of the module 10 depicted in FIG. 7 taken along section line C-C. As illustrated in FIG. 8, a portion of IC 19 representative of the die of that device is identified by the reference 19D. Die 19D is inserted, at least in part, into cooling structure 21 which is disposed over opening 250 in substrate 14. Die 19D is shown disposed abutting fin assembly 21FA which is comprised of plural fins 21F. As with some of the earlier depicted embodiments, the substrate of module 10 of FIG. 8 exhibits an offset between the axis $A_{XB}$ of substrate body 14B and axis $A_{XE}$ of end portion 14E of substrate 14 that allows substrate space 15S.

Figure 9:
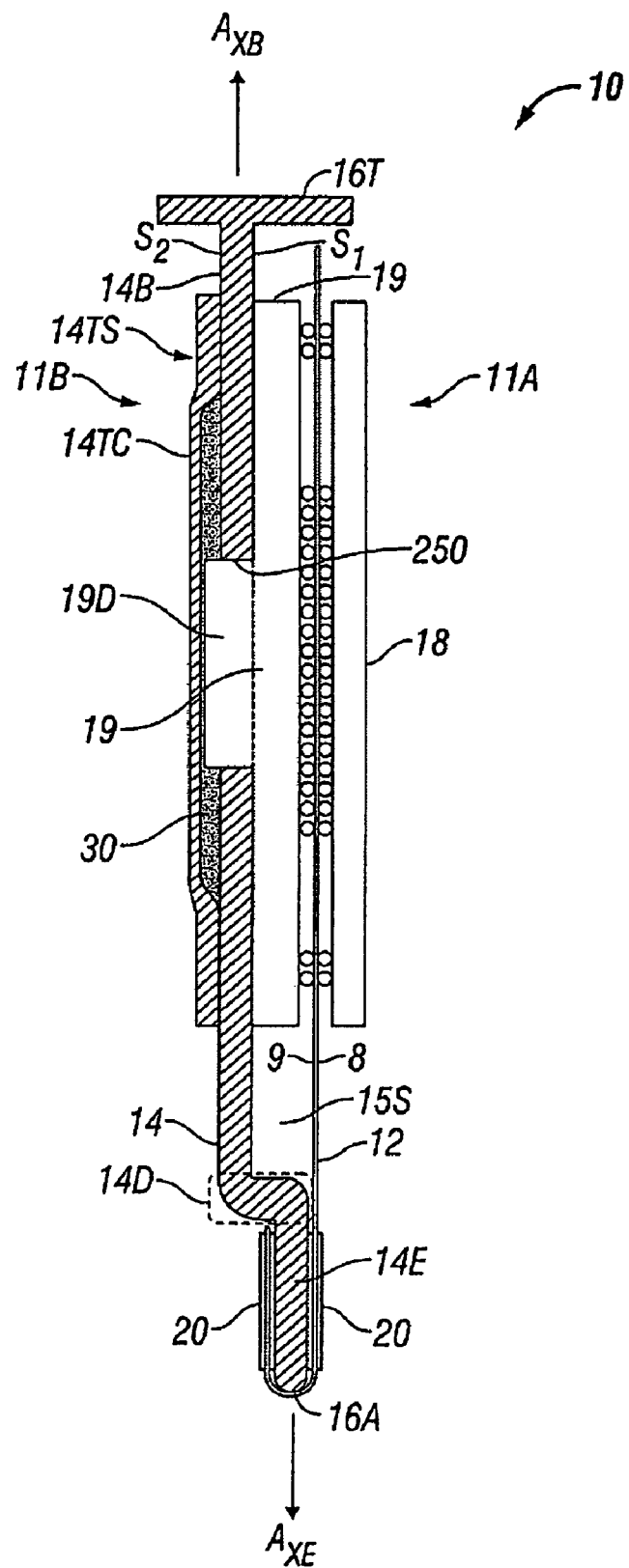
FIG. 9 is cross-sectional view of a module in accordance with an alternative preferred embodiment of the present invention.

The module embodiment depicted in FIG. 9 does not exhibit a plurality of fins 21F, but includes a thermal sink 14TS with a central area 14TC. Those of skill will recognize that an alternative embodiment module may be devised in accordance with the principles disclosed herein that exhibits both a thermal sink and a cooling structure.

Thermal sink 14TS is comprised, in this preferred embodiment, of high thermal conductivity such as, for example, copper or copper alloy and, in this preferred embodiment, is substantially larger than and preferably in thermal contact with die 19D either directly or through thermally-conductive adhesive such as the depicted adhesive 30 or a thermally-conductive gasket material, for example. Thermal contact with a part of IC 19 should be considered thermal contact with IC 19.

In this preferred embodiment, central portion 14TC of thermal sink 14TS is raised above the periphery of thermal sink 14TS and additionally provides on its other side, an indentation into which may be introduced at least a portion of IC 19 such as, for example, die 19D, to assist in realization of a low profile for module 10. An indentation is not required, however. In the preferred depicted embodiment, thermal sink 14TS is disposed over a window 250 through substrate 14. IC 19, which is mounted on side 9 (the "inside" in this embodiment) of flex circuit 12, is disposed, at least in part, into window 250 to realize thermal contact with thermal sink 14TS to provide a conduit to reduce thermal energy loading of IC 19.

Thermal sink 14TS need not cover the entirety of window 250. In other embodiments, for example, thermal sink 14TS may merely be across the window 250 or thermal sink 14TS may be set into window 250 instead of over or across the opening of window 250. Thermal sink 14TS is typically a separate piece of metal from substrate 14 but, after appreciating this specification, those of skill will recognize that, in alternative instances, thermal sink 14TS may be integral with substrate 14 or a particular portion of substrate 14 may be constructed to be a thermal sink 14TS in accordance with the teachings herein. For example, substrate 14 may be comprised of aluminum, while a thermal sink area 14TS of substrate 14 may be comprised of copper yet substrate 14 and thermal sink 14TS are of a single piece. In a variation of such an integral thermal sink-substrate embodiment, the thermal sink could be attached to the substrate without a window and thus be preferentially accessible only on one side of substrate 14. Construction expense will be more likely to militate against such construction, but the principles of the invention encompass such constructions. Consequently, a window in substrate 14 is not required. Therefore, a thermal sink 14TS should be considered to be an area or element integral with or attached to a substrate 14 and the material from which that thermal sink is composed exhibits greater thermal conductivity than the material of the substrate. To continue the example, substrate 14 may be aluminum, while thermal sink 14TS is comprised of copper. U.S. patent application Ser. No. 11/231, 418, filed Sep. 21, 2005 and pending is owned by Staktek Group L.P. and which has been incorporated by reference herein, provides other examples of modules 10 with thermal sinks 14TS and shows a module with an integral thermal sink 14TS in certain figures from that application.

Where a window 250 in substrate 14 is employed, at least a part of thermal sink 14TS should be accessible through window 250 from the "other" side of substrate 14. AMB circuit 19 or other high heat IC 19 and, in particular, die 19D, may be disposed in or across or over window 250 and preferably, will be introduced into an indentation of thermal sink 14TS and disposed in thermal contact with thermal sink 14TS and, more preferably, with the central core 14TC of thermal sink 14TS (where a central core has been optionally included in thermal sink 14TS) either with direct contact or through thermal adhesives or glues. Other embodiments may include additional windows where other high heat circuits are employed on module 10. Still other embodiments may insert some or all of ICs 18 into cutout areas 240 in substrate 14 as described in detail in U.S. patent application Ser. No. 11/005, 992, filed Dec. 7, 2004 which is owned by Staktek Group L.P. and has been incorporated by reference herein.

Figure 10:
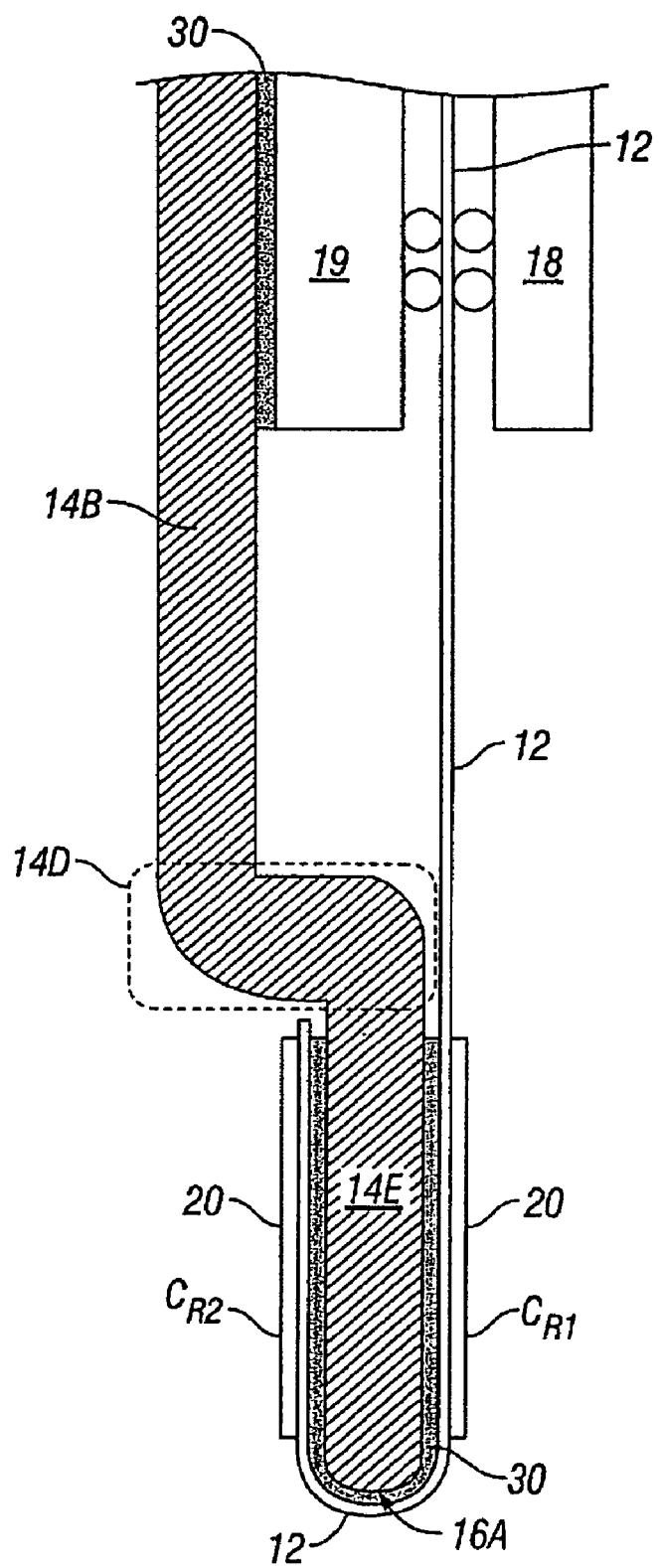
FIG. 10 depicts an enlarged cross-sectional view of a portion of an embodiment in accordance with the present invention.

FIG. 10 depicts in enlarged view an area about deformation 14D of substrate 14 to illustrate how a part of populated flex circuit 12 is disposed about edge 16A of substrate 14. While a rounded configuration is shown, edge 16A may take on other shapes devised to mate with various connectors or sockets. The form and function of various edge card connectors are well know in the art. In many preferred embodiments, flex 12 is wrapped around edge 16A of substrate 14 and may be laminated or adhesively connected to substrate 14 with adhesive 30. The depicted adhesive 30 and flex 12 may vary in thickness and are not drawn to scale to simplify the drawing. The depicted substrate 14 preferably has a thickness such that when assembled with the flex 12 and adhesive 30, the thickness measured between module contacts 20 falls in the range specified for the mating connector. Adhesive 30 is preferably employed to attached flex circuit 12 to substrate 14 and contacts 20 are disposed on each side of module 10. In other embodiments, contacts 20 need not be on both sides of module 10 and may be exhibited on only one side in configurations.

Figure 11:
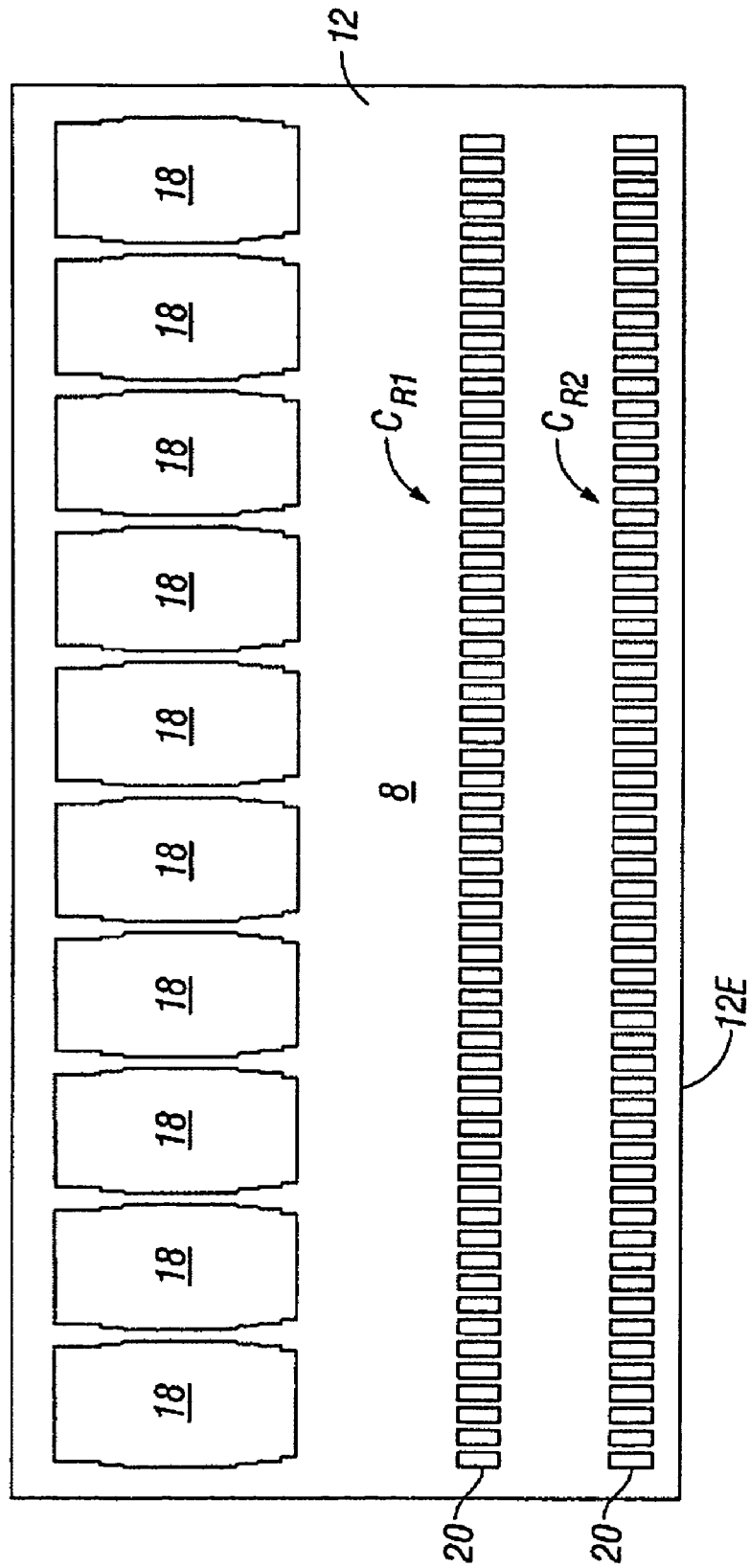
FIG. 11 depicts a major side of a flex circuit devised in accord with a preferred embodiment of the present invention.

FIG. 11 depicts a first side 8 of flex circuit 12 ("flex", "flex circuitry", "flexible circuit") used in constructing a module according to an embodiment of the present invention. Flex circuit 12 is preferably made from one or more conductive layers supported by one or more flexible substrate layers as further described with reference to later FIG. 12. The construction of flex circuitry is known in the art. The entirety of the flex circuit 12 may be flexible or, as those of skill in the art will recognize, the flexible circuit structure 12 may be made flexible in certain areas to allow conformability to required shapes or bends, and rigid in other areas to provide rigid and planar mounting surfaces. FIG. 11 depicts a side 8 of flex circuit 12 populated with exemplar ICs 18 profiled to illustrate that many different types of ICs 18 may be employed. Contacts 20 are shown in two pluralities $CR_1$ and $CR_2$ which are disposed closer to edge 12E of flex circuit 12 than the ICs 18 are disposed.

ICs 18 on flexible circuit 12 are, in this embodiment, chip-scale packaged memory devices of small scale. For purposes of this disclosure, the term chip-scale or "CSP" shall refer to integrated circuitry of any function with an array package providing connection to one or more die through contacts (often embodied as "bumps" or "balls" for example) distributed across a major surface of the package or die. CSP does not refer to leaded devices that provide connection to an integrated circuit within the package through leads emergent from at least one side of the periphery of the package such as, for example, a TSOP.

Embodiments of the present invention may be employed with leaded or CSP devices or other devices in both packaged and unpackaged forms but where the term CSP is used, the above definition for CSP should be adopted. Consequently, although CSP excludes leaded devices, references to CSP are to be broadly construed to include the large variety of array devices (and not to be limited to memory only) and whether die-sized or other size such as BGA and micro BGA as well as flip-chip. As those of skill will understand after appreciating this disclosure, some embodiments of the present invention may be devised to employ stacks of ICs each disposed where an IC 18 is indicated in the exemplar Figs. Multiple integrated circuit die may be included in a package depicted as a single IC 18.

While in this embodiment memory ICs are used to provide a memory expansion board or module, and various embodiments may include a variety of integrated circuits and other components. Such variety may include microprocessors, FPGA's, RF transceiver circuitry, digital logic, as a list of non-limiting examples, or other circuits or systems which may benefit from a high-density circuit board or module capability. In some preferred embodiments, circuit 19 will be an AMB, but the principles of the invention may be employed with a variety of devices such as, for example, a microprocessor or graphics processor employed in a circuit module while other embodiments will consist essentially of memory ICs only.

Figure 12:
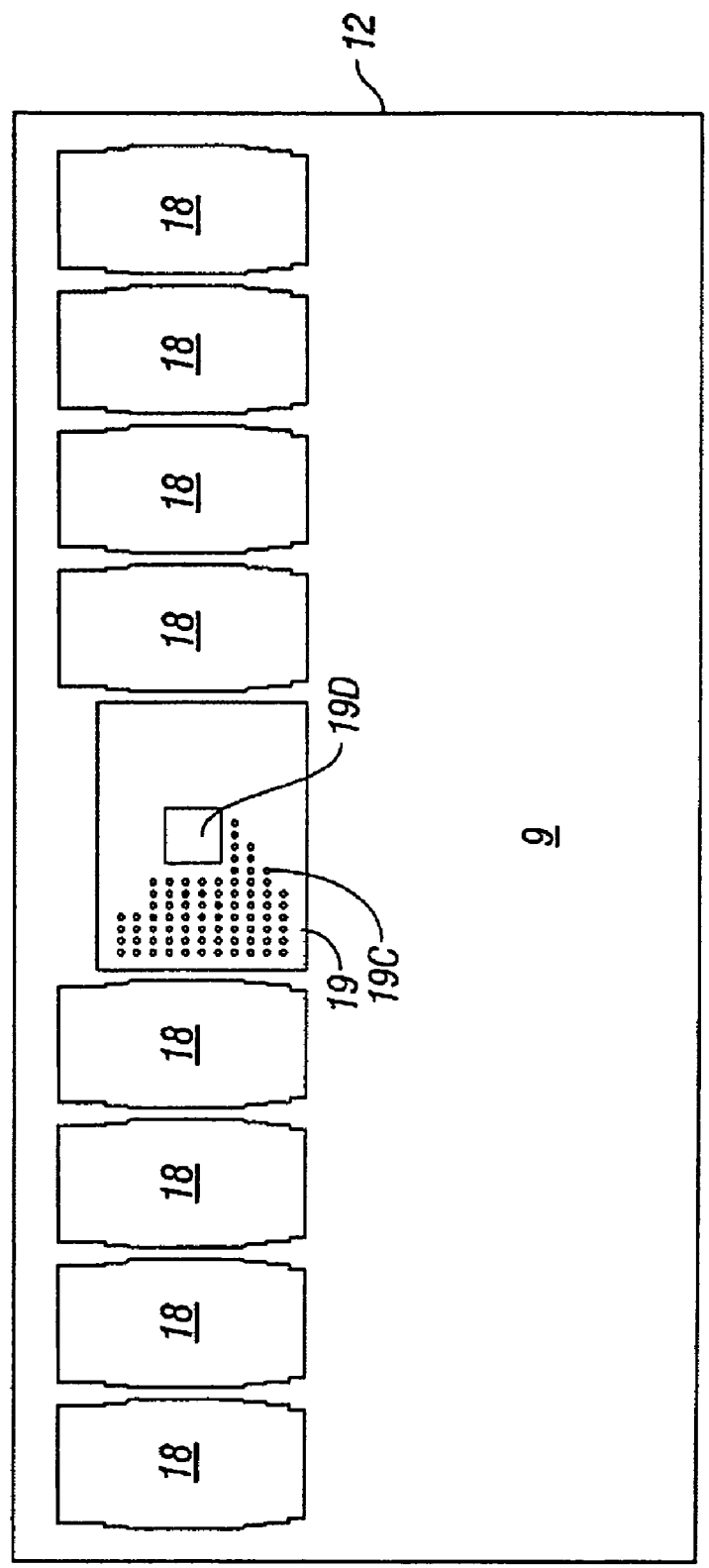
FIG. 12 depicts another major side of a flex circuit devised in accordance with a preferred embodiment of the present invention.

FIG. 12 depicts a side 9 of flex circuit 12 illustrating an IC population of flex circuit 12 that includes an IC 19 which is depicted to be an AMB with die 19D and contacts 19C. Typically, side 9 will be closer to substrate 14 than will be side 8 of flex circuit 12 when module 10 is assembled.

Figure 13:
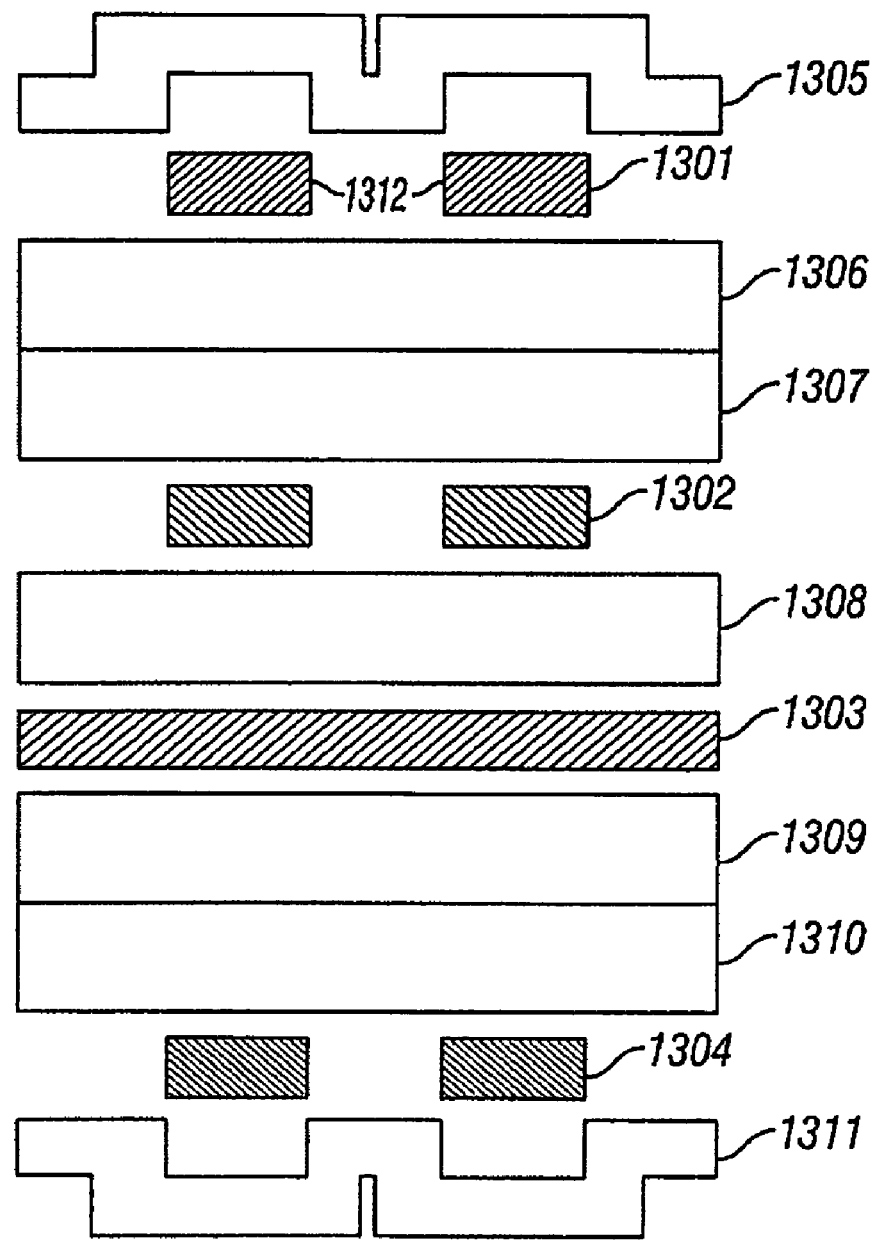
FIG. 13 depicts an exploded cross-sectional view of a flex circuit in accordance with a preferred embodiment of the present invention.

FIG. 13 is an exploded depiction of a flex circuit 12 cross-section according to one preferred embodiment of the present invention. The depicted flex circuit 12 has four conductive layers 1301-1304 and seven insulative layers 1305-1311. The numbers of layers described are merely those used in one preferred embodiment and other numbers of layers and arrangements of layers may be employed. Even a single conductive layer flex circuit 12 may be employed in some embodiments, but flex circuits with more than one conductive layer prove to be more adaptable to more complex embodiments of the invention.

Top conductive layer 1301 and the other conductive layers are preferably made of a conductive metal such as, for example, copper or alloy 110. In this arrangement, conductive layers 1301, 1302, and 1304 express signal traces 1312 that make various connections by use of flex circuit 12. These layers may also express conductive planes for ground, power or reference voltages.

In this embodiment, inner conductive layer 1302 expresses traces connecting to and among various ICs. The function of any one of the depicted conductive layers may be interchanged in function with others of the conductive layers. Inner conductive layer 1303 expresses a ground plane, which may be split to provide VDD return for pre-register address signals. Inner conductive layer 1303 may further express other planes and traces. In this embodiment, floods or planes at bottom conductive layer 1304 provides VREF and ground in addition to the depicted traces.

Insulative layers 1305 and 1311 are, in this embodiment, dielectric solder mask layers which may be deposited on the adjacent conductive layers for example. Other embodiments may not have such adhesive dielectric layers. Insulating layers 1306, 1308, and 1310 are preferably flexible dielectric substrate layers made of polyimide. However, any suitable flexible circuitry may be employed in the present invention and the depiction of FIG. 13 should be understood to be merely exemplary of one of the more complex flexible circuit structures that may be employed as flex circuit 12.

Although the present invention has been described in detail, it will be apparent to those skilled in the art that many embodiments taking a variety of specific forms and reflecting changes, substitutions and alterations can be made without departing from the spirit and scope of the invention. Therefore, the described embodiments illustrate but do not restrict the scope of the claims.

The invention claimed is:

1. A circuit module comprising:
   (a) a rigid substrate having first and second opposing lateral sides, a body section having a body section axis and an end section having an end section axis and the rigid substrate having a deformation area between the body section and the end section to offset from each other the body section and end section axes to create a substrate space disposed on a selected one of the first and second opposing lateral sides of the rigid substrate; and
   (b) a flex circuit having first and second sides, the first side of the flex circuit having a plurality of flex contacts, a portion of the flex circuit being wrapped about and in contact with the first opposing lateral side of the rigid substrate to dispose the plurality of flex contacts along the first opposing lateral side of the substrate, the flex circuit being populated along its second side with plural ICs of a first type disposed in the substrate space between the flex circuit and the rigid substrate.

2. The circuit module of claim 1 further comprising at least one IC of a second type populated on the second side of the flex circuit which at least one IC of the second type is disposed at least in part in the substrate space between the flex circuit and the rigid substrate.

3. The circuit module of claim 1 further comprising a cooling structure along the second of the first and second lateral opposing sides of the rigid substrate.

4. The circuit module of claim 3 in which the cooling structure comprises a plurality of fins.

5. The circuit module of claim 4 in which the plurality of fins are oriented perpendicularly to the body section axis of the rigid substrate.

6. The circuit module of claim 1 in which the rigid substrate is comprised of thermally conductive material.

7. The circuit module of claims 1, 2 or 3 in which the rigid substrate is comprised of metallic material.

8. The circuit module of claims 1, 2 or 3 in which a thermal sink is appended to the rigid substrate.

9. The circuit module of claim 1 in which the plural ICs of the first type are memory devices.

10. The circuit module of claim 9 in which the plural ICs of the first type are CSP memory devices.

11. The circuit module of claims 1, 2 or 3 in which the flex circuit comprises more than one conductive layer.

12. The circuit module of claim 1 further comprising an extension diverging in orientation from the body axis of the rigid substrate.

13. The circuit module of claim 12 in which the rigid substrate is comprised of thermally conductive material.

14. The circuit module of claim 12 in which the flex circuit comprises more than one conductive layer.

* * * * *

UNITED STATES PATENT AND TRADEMARK OFFICE
CERTIFICATE OF CORRECTION

| | | |
|---|---|---|
| PATENT NO. | : 7,542,297 B2 | Page 1 of 1 |
| APPLICATION NO. | : 11/255061 | |
| DATED | : June 2, 2009 | |
| INVENTOR(S) | : James Douglas Wehrly, Jr. | |

It is certified that error appears in the above-identified patent and that said Letters Patent is hereby corrected as shown below:

In Claim 1, column 8, line 54, delete "the substrate" and insert -- the rigid substrate --, therefor.

Signed and Sealed this

Fourth Day of August, 2009

JOHN DOLL
*Acting Director of the United States Patent and Trademark Office*